United States Patent [19]

Feinberg

[11] Patent Number: 4,684,891
[45] Date of Patent: Aug. 4, 1987

[54] RAPID MAGNETIC RESONANCE IMAGING USING MULTIPLE PHASE ENCODED SPIN ECHOES IN EACH OF PLURAL MEASUREMENT CYCLES

[75] Inventor: David A. Feinberg, Berkeley, Calif.

[73] Assignee: The Regents of the University of California, Berkeley, Calif.

[21] Appl. No.: 760,832

[22] Filed: Jul. 31, 1985

[51] Int. Cl.$^4$ ............................................. G01R 33/20
[52] U.S. Cl. ..................................... 324/309; 324/307
[58] Field of Search ............... 324/300, 307, 309, 310, 324/311, 312, 318, 322

[56] References Cited

U.S. PATENT DOCUMENTS

| 4,070,611 | 1/1978 | Earnst | 324/307 |
|---|---|---|---|
| 4,297,637 | 10/1981 | Crooks et al. | 324/309 |
| 4,318,043 | 3/1982 | Crooks et al. | 324/309 |
| 4,355,282 | 10/1982 | Young | 324/309 |
| 4,471,305 | 9/1984 | Crooks et al. | 324/309 |
| 4,567,440 | 1/1986 | Haselgrove | 324/309 |
| 4,570,119 | 2/1986 | Wehrli | 324/309 |
| 4,587,489 | 5/1986 | Wehrli | 324/309 |

OTHER PUBLICATIONS

Kumar et al, J. Mag., Res. 18, 69–83 (1975).
Mansfield et al, J. Mag., Res. 29. 335–373 (1978).

Primary Examiner—Michael J. Tokar
Attorney, Agent, or Firm—Nixon & Vanderhye

[57] ABSTRACT

Slice selective 90° and plural subsequent 180° NMR RF pulses are utilized to elicit a train of NMR spin echoes from a given slice or "planar volume" of the object under test in each of plural measurement cycles. Spatial information is encoded within the spin echo by imposing a $G_x$ gradient during each spin echo readout. Phase encoding in a second $G_y$ dimension is achieved by using (1) a cycle-dependent $\beta G_y$ gradient at least once during each NMR measurement cycle and (2) further $\delta G_y$ magnetic gradient pulses in association with some or all of the individual spin echo responses within each measurement cycle. The two different types of $G_y$ gradient pulses are dimensioned and timed so as to result in the desired number of phase encoded spin echo signals which subsequently can be arranged in a linearly increasing progression of phase encoding so as to be usable in a two-dimensional Fourier transformation process to produce an NMR image. Because the spin echo data are taken at different times of echo occurrences within a given measurement cycle, T2 artifact may be present in such an image. However T2 correction may be provided by calculating T2 and scaling all of the time domain spin echo data to a single common equivalent time of echo occurrence before performing the final two-dimensional Fourier transformation process which results in a final T2-corrected NMR image.

26 Claims, 12 Drawing Figures

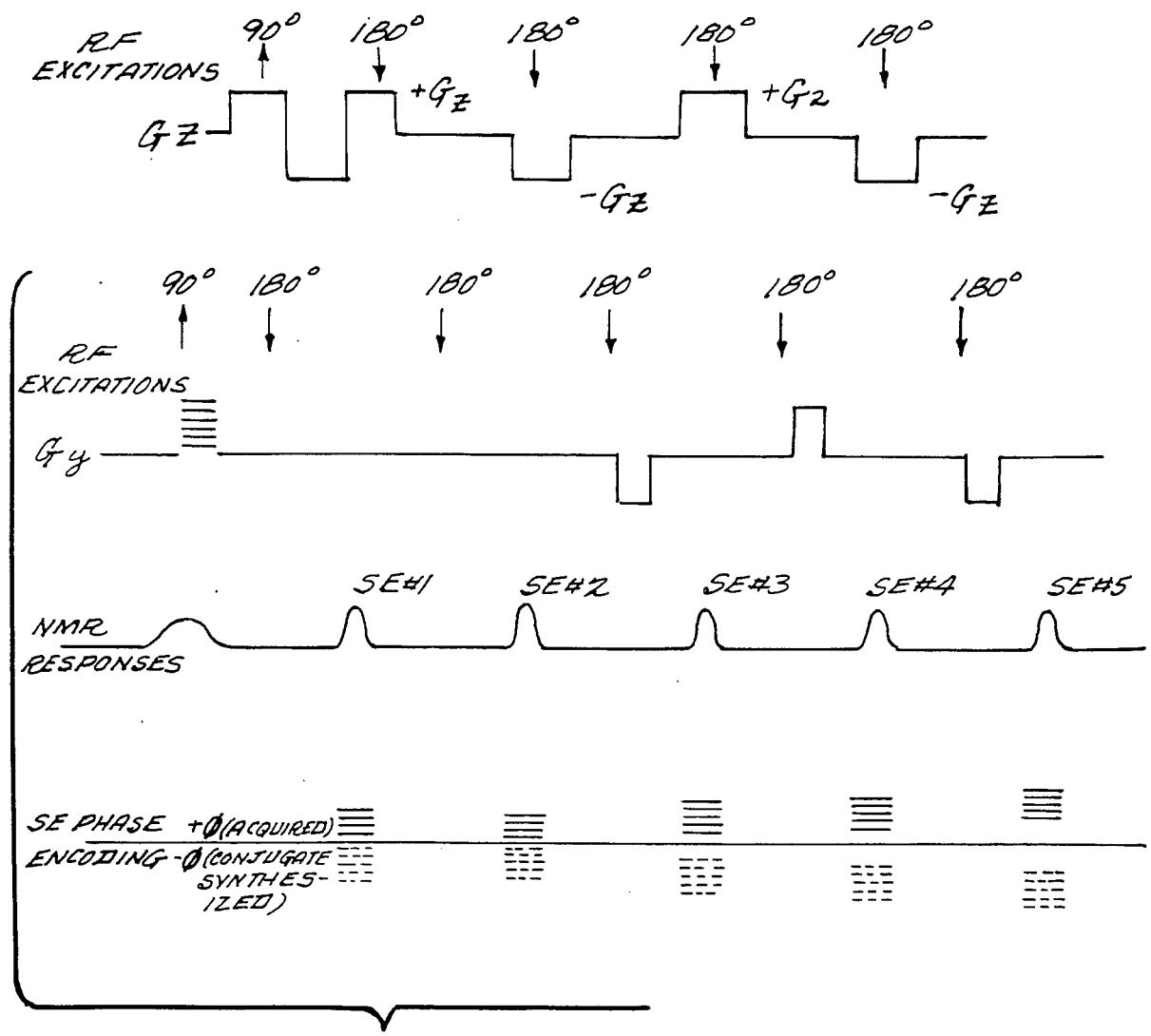

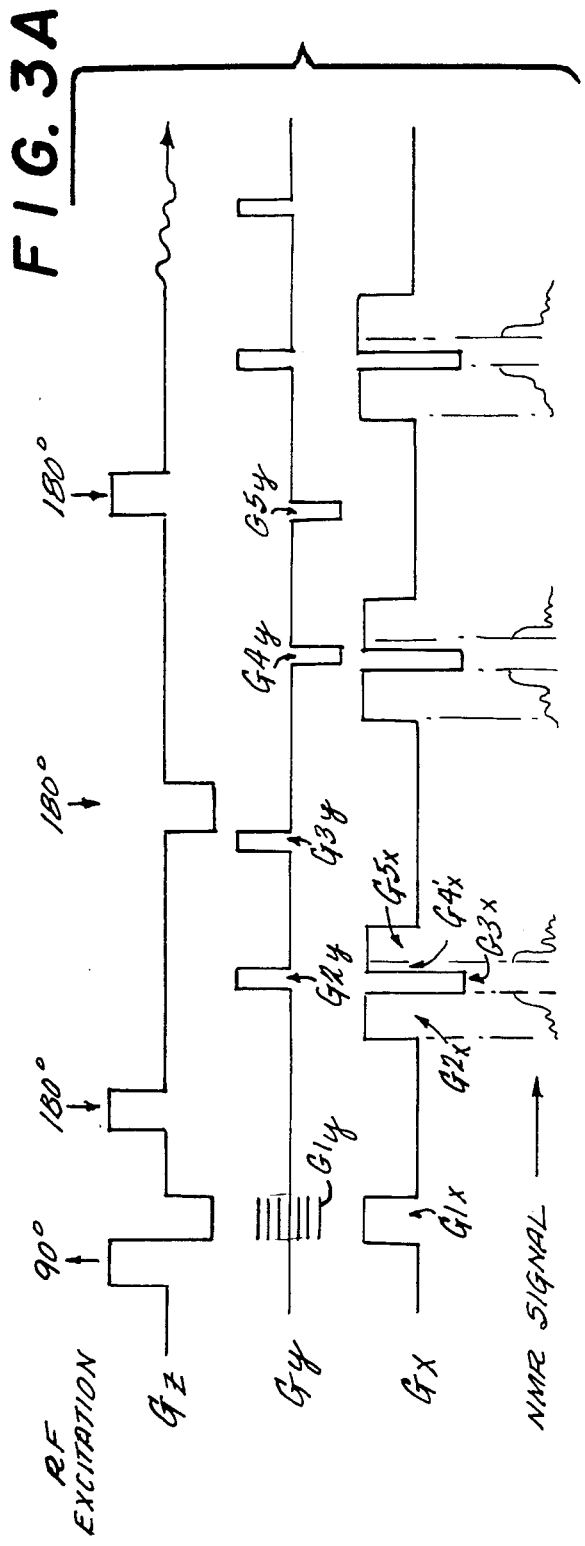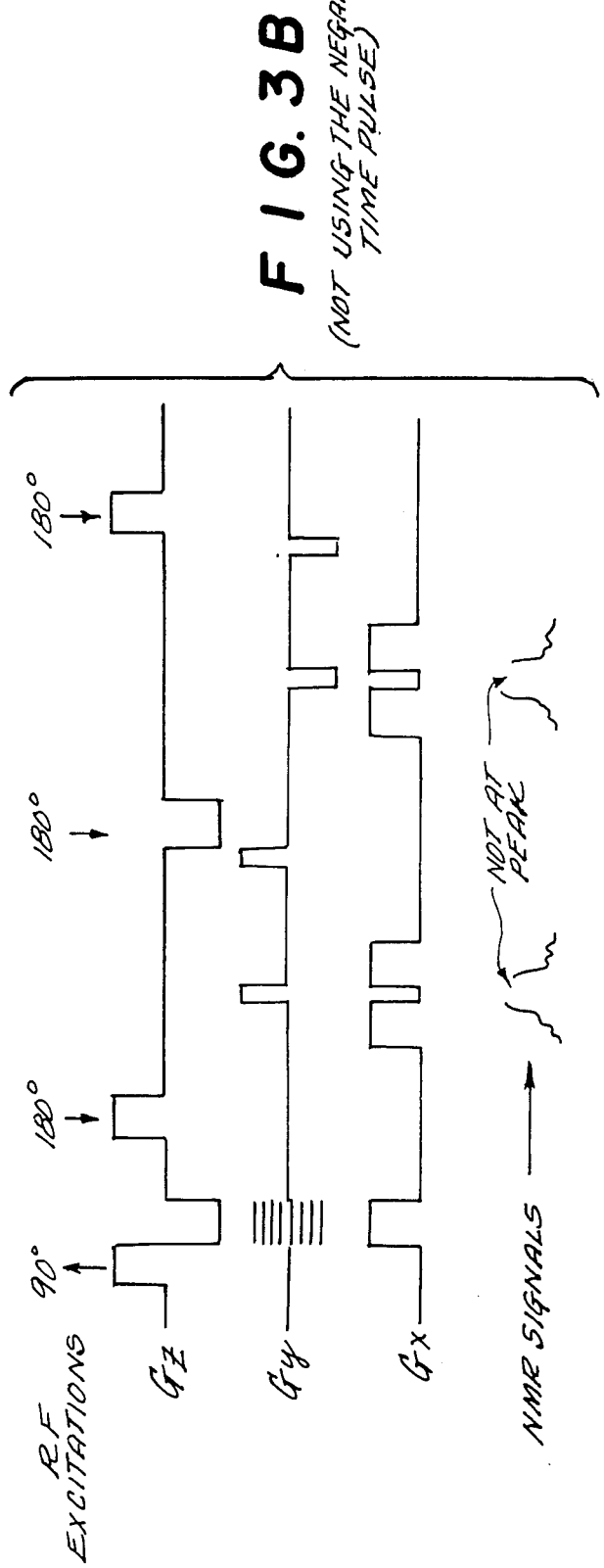

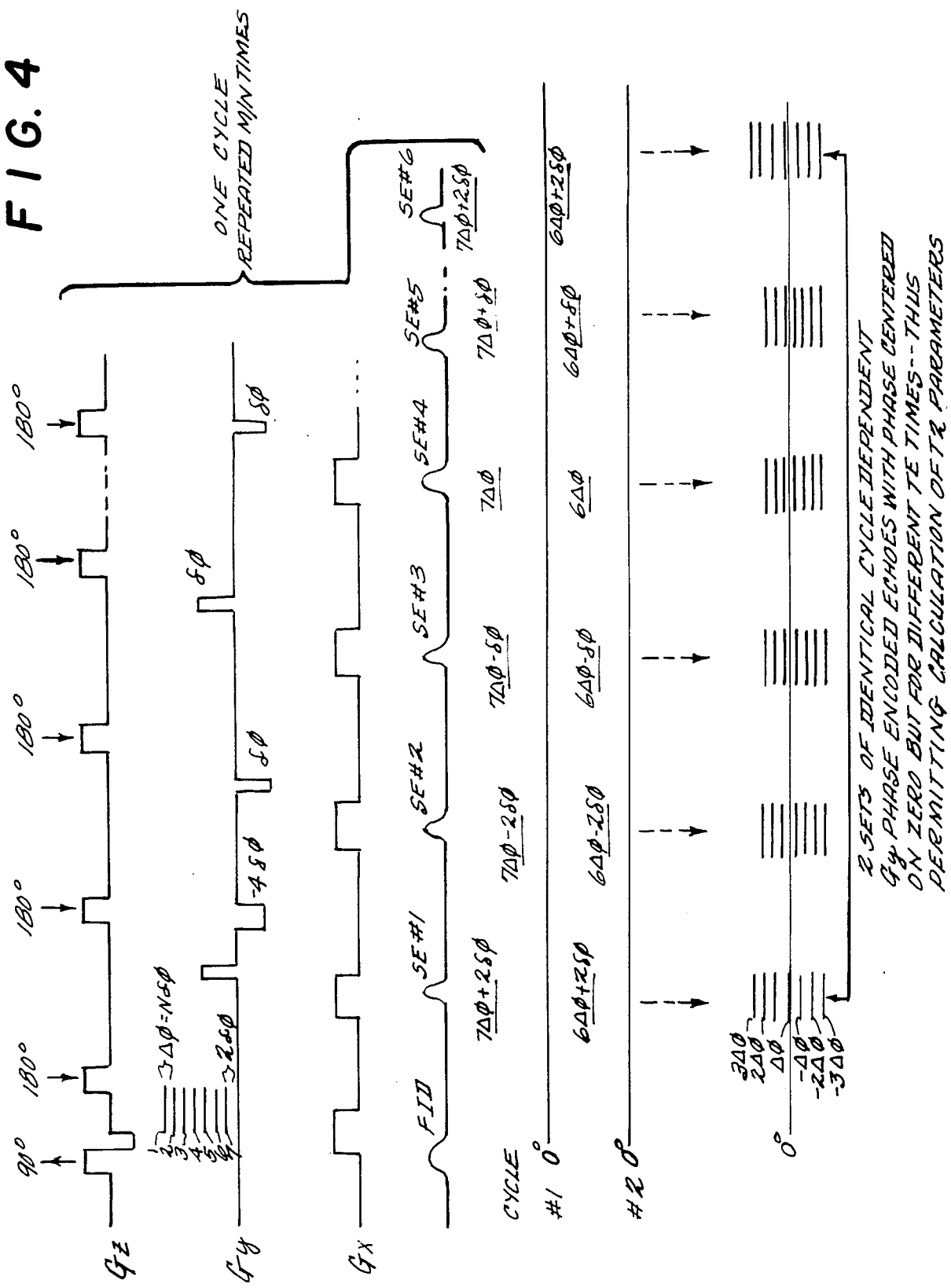

F I G. 7

RAPID MAGNETIC RESONANCE IMAGING USING MULTIPLE PHASE ENCODED SPIN ECHOES IN EACH OF PLURAL MEASUREMENT CYCLES

This invention is related to the field of mangetic resonance imaging (MRI) utilizing nuclear magnetic resonance (NMR) phenomena. It is particularly related to novel apparatus and method for acquisition of NMR image data (and for T2-dependence correction of same). It uses an NMR imaging technique wherein slice-selective NMR RF excitations including a train of 180° nutation pulses are utilized to elicit a corresponding train of plural NMR spin echo RF signal responses (which are readout during an imposed magnetic gradient pulse along a first dimension). This invention provides a novel and advantageous technique for more rapidly acquiring such NMR spin echo RF signals with requisite phase encoding in a second dimension where relatively large "whole body" sizes are involved.

This application is related to earlier filed, commonly assigned, patents and applications of Crooks et al including U.S. Pat. Nos. 4,297,637; 4,318,043; 4,471,305; and 4,599,565 (issued from Ser. No. 515,117 filed july 19, 1983). The contents of these referenced related patents and/or patent applications is hereby incorporated by reference.

Magnetic resonance imaging (MRI) is now coming into widespread commercial usage. Nevertheless, there are still many possible areas of improvement. One such area for potential improvement relates to the time required to acquire the NMR image data for a complete image in a "whole body" type of scanner (i.e. dimensioned to accept an entire human body within a cryogenic static magnetic field coil as well as included magnetic gradient coils and RF signal transmission/reception coils). The necessary relatively large dimension of the gradient coils causes inherent inductance which, in turn, limits the speed with which the various magnetic gradient coils can be effectively switched on and off during a given data acquisition cycle.

Prior MRI data acquisition techniques can be grouped into at least three different categories distinguished by the way in which spatial encoding is achieved using magnetic gradients.

Multiple section imaging as performed by Crooks et al (see the above referenced related U.S. patents and patent applications and see also Kumar, Welti, Earnst at J. Mag. Res. 18, 69–83, 1975) utilizes slice selective magnetic gradient pulses which are "on" during each radio frequency pulse (e.g. 90° nutation pulses and 180° nutation pulses) so as to achieve NMR at the Larmor frequency within a selected planar volume without substantially disturbing the spin lattice of adjacent planar volumes (each incident radio frequency pulse is typically modulated by a sinc function so as to select a substantially square edged planar volume in the spatial domain). After extracting the useful spin echo NMR RF response from a given planar volume, it is allowed to relax to its quiescent alignment with a static z-axis magnetic field while, in the meantime, other planar volumes are similarly selectively defined by suitable magnetic gradient pulses and sinc-modulated RF NMR pulses so as to produce the desired NMR spin echo responses from these other planar volumes. After a sequence of planar volumes have thus been irradiated and their respective NMR responses captured for subsequent analysis, the entire sequence is repeated many times with incrementally increased magnetic gradient along an orthogonal y-axis so as to encode spatial information. Spatial information for the second x-axis dimension is encoded by imposing a constant magnetic gradient pulse along the x-axis during each spin echo NMR signal readout. The y-axis phase encoding is changed for each of M NMR cycles so as to provide a linearly increasing progression of y-axis phase encoding (the number of resulting image lines along the y-axis will be equal to the number M of phase encoding cycles of the sequence). A two-dimensional Fourier transformation process is then utilized to obtain the final NMR image (see above referenced U.S. Pat. No. 4,599,565).

This prior Crooks et al technique is depicted at FIG. 2 of the present application. As will be appreciated, for a given y-axis resolution of M lines per image, one must repeat the measurement cycle M times. Since a given measurement cycle can only be repeated after at least about one T1 interval (often on the order of one second or more), it can be seen that for an image of reasonable y-axis resolution, a considerable time must be devoted to the data acquisition procedure. This is a disadvantage from several aspects. First of all, the MRI equipment and staff is quite expensive and therefore relatively long data acquisition time requirements tend to make poor utilization of this significant investment. Secondly, where living bodies are under examination, it is sometimes difficult to control voluntary and/or involuntary body movements (both external and internal) so as to remain substantially stationary during a given overall data acquisition procedure for a single NMR image.

A very fast data acquisition technique has been proposed by Mansfield et al in J. Mag. Res. 29, p. 335–373 (1978) which is sometimes called "Echo Planar Imaging". Here, all of the required NMR image data is obtained in a single NMR pulse sequence thus avoiding the need to let a given volume "relax" between repeated cycles of NMR pulse sequences. Relatively rapid modulation of an NMR RF response signal is achieved using a rapidly switched magnetic gradient so as to encode spatial information within a single train of NMR response signals. Indeed, two dimensions of spatial information can be encoded within a single NMR measurement cycle sequence. Reportedly less than 100 milliseconds per image is required for data acquisition using this Mansfield technique.

However, because the Mansfield technique requires very rapid switching of magnetic field gradient pulses (e.g. so as to produce the requisite large number of sustained spin echoes) it cannot be used with the large size magnetic gradient coils required for "whole body" MRI scanners. Rather, only the use of relatively small gradient coils (with reduced inherent inductance) and higher applied voltage/current levels can achieve the relatively fast magnetic gradient rise times (e.g. in terms of microseconds) required for practical implementation of the Mansfield et al technique. Young (U.S. Pat. No. 4,355,282) proposes a modification to this echo planar imaging technique wherein pulsed magnetic gradients increase in phase encoding amplitude for successive FID signals and on successive cycles of the pulse sequence.

Yet another group of MRI data acquisition techniques (sometimes termed "three-dimensional volume imaging", see Earnst, U.S. Pat. No. 4,070,611) do not use slice selective magnetic gradients to define multiple image volumes. Instead, a three-dimensional Fourier transformation uses phase encoding magnetic gradients on each spatial axis perpendicular to each image plane. Two orthogonal magnetic gradient axes produce cycle dependent changes in phase for M image lines and S number of image slices or sections. The total number of pulse sequence cycles is then $M \times S \times C$, where C is the number of cycles or repetitions of the sequence.

Currently, most clinically useful MRI scanners utilize Fourier transformation reconstruction techniques and require data acquisition times typically between 5 and 40 minutes. However, the present invention can achieve clinically useful MRI with significantly reduced data acquisition times (e.g. between 5 and 40 seconds) achieved using relatively slower magnetic gradient switching times (e.g. in the millisecond range) that can be practically realized with whole body sized MRI scanners.

Of the prior MRI data acquisition techniques, the Crooks et al technique has many advantages which are retained by the improvement of this invention. For example, the Crooks et al technique of using 180° RF nutation pulses to produce spin echo RF responses (instead of utilizing rapidly switched magnetic gradients to elicit spin echoes) results in substantial cancellation of signal artifacts at each spin echo time of occurrence otherwise expected due to background magnetic field inhomogeneities. Such static magnetic field inhomogeneities result in accumulated errors in the echo planar technique or in switched magnetic gradient techniques used for signal refocusing and thus cause errors in the spatially-encoded phase information. Furthermore, using the Crooks et al 180° RF nutation pulses to elicit multiple spin echoes avoids accumulation of signal artifact caused by NMR responses due to the chemical shift of nuclei (e.g. large apparent spatial separation of water and fat nuclei signals is thus avoided). On the other hand, echo planar or magnetic gradient reversal techniques for refocusing the FID cause phase information resulting from chemical shift to accumulate in each successive spin echo response. Furthermore, the Crooks et al technique of using 180° RF nutation pulses to produce spin echoes permits much longer spin echo signal formation times to be achieved thus producing higher signal to noise ratios.

The Crooks et al technique may produce a "ghost" artifact in the image. However, I have discovered that such an artifact may be reduced or eliminated by using slice selections magnetic gradients pulses of alternating polarity.

Accordingly, this invention retains most of the advantageous features of the prior Crooks et al data acquisition procedure while at the same time modifying that procedure so as to significantly reduce the required data acquisition time for NMR image data relating to a given planar volume and, if desired, so as to also reduce possible "ghost" image artifact. (Throughout this application, the term "planar volume" is used to denote a relatively thin cross-sectional volume through an object for which a cross-sectional NMR image is desired.)

In this invention, y-axis spatial information is phase encoded within a multiple spin echo pulse sequence using two different types and/or increments of phase change. For example, a cycle-dependent y-axis $\beta$ magnetic gradient pulse is employed at least once during each basic NMR pulse sequence. In addition, incremental y-axis $\delta$ magnetic gradient pulses are employed between some or all of the individual spin echoes within a given NMR measurement cycle sequence so as to produce a succession of y-axis phase encoded spin echoes during a single NMR pulse measurement sequence or cycle. Since the magnitude of spin echo responses exponentially decreases in accordance with the T2 NMR parameter, it is not possible to obtain all of the desired y-axis phase encoded spin echo data within a single measurement cycle. Accordingly, plural measurement cycles are still required and the cycle-dependent y-axis $\beta$ gradient pulse is utilized in conjunction with the incremental y-axis $\delta$ gradient pulses so as to produce a requisite number of y-axis phase encoded spin echoes (i.e. with a linear progression of encoded phase increment between each of successive spin echoes—perhaps after a re-organizational grouping during a data processing phase) after a relatively fewer number of repeated measurement cycles than was heretofore required using the Crooks et al technique. Accordingly, the overall data acquisition time required for a given image has been reduced.

Unfortunately, because the y-axis phase encoded spin echo data is now acquired at times which extend throughout each of relatively long basic measurement cycles, the spin echo responses within a given measurement cycle will be reduced in amplitude exponentially in accordance with the T2 NMR parameter. Unless some correction is made, this can be expected to induce artifact into the resulting NMR image. However, in the preferred embodiment of this invention, such T2 artifact is corrected before the final NMR image is constructed.

In brief, the T2 parameter is calculated based on the assumption that it is mono-exponential. Preferably, the T2 NMR parameter is derived for each pixel (or for a neighborhood about each pixel) and the raw data is then scaled so as to remove (or at least substantially reduce) T2-dependence in the time-domain spin echo data before it is utilized to produce the final NMR image.

In one exemplary embodiment, a low resolution image is first constructed (by a two-dimensional Fourier transform technique) using data taken from plural NMR pulse sequence cycles but occurring at the same relative times of echo occurrence $TE_2$. A similar low resolution image is constructed for some different time of echo occurrence. Having thus defined two points on an assumed mono-exponential curve, the exponential T2 factor can be calculated for each pixel of these low resolution images. (Since the low resolution images have reduced resolution along the y-axis, each "pixel" of such a low resolution image will actually correspond to an average of several pixels along the y-axis in a final image. To this extent, the T2 compensation in the final full resolution image may not be exactly pixel-for-pixel, but it nevertheless will substantially reduce T2 dependence.

Once the T2 parameter has thus been calculated for each pixel of such a low resolution image, a similar low resolution image $LRI_n$ is created for each time of echo occurrence $TE_n$ and the magnitude of pixel values in each such image is then scaled so as to compensate for the calculated T2 at that particular pixel site (e.g. by effectively translating the magnitude to a common time of echo occurrence TE).

Thereafter, each of the low resolution images (one corresponding to each time of echo occurrence) is inverse Fourier transformed so as to now provide T2-corrected time domain spin echo data. Such T2-corrected data is then correlated and arranged to provide a composite set of y-axis phase encoded spin echo data with a linear progression of increasing equal phase-encoded increments between each successive spin echo of the sequence before it is conventionally processed by two-dimensional Fourier transformation to produce a final NMR image of full resolution in both the x- and y-axis dimensions.

Thus, in brief summary, this invention improves upon the prior Crooks et al data acquisition procedure by acquiring multiple progressively phase encoded spin echoes within a single NMR measurement cycle thus reducing the required number of cycle repetitions to acquire a complete set of y-axis encoded spin echo data. Unfortunately, as a result of using spin echo data taken from a somewhat lengthened individual measurement cycle, T2-dependent image artifact is inherently produced. However, this invention also contemplates a number of techniques for greatly reducing or "deconvolving" such T2-induced image artifact. The result is a reduced data acquisition time requirement for a given single NMR image of a selected "slice" or planar volume through an object (e.g. a living human or animal subject) in a "whole body" sized MRI scanner.

These as well as other objects and advantages of this invention will be better understood and appreciated by carefully reading the following detailed description of the presently preferred exemplary embodiments of this invention in conjunction with the accompanying drawings, of which:

Figure 2:
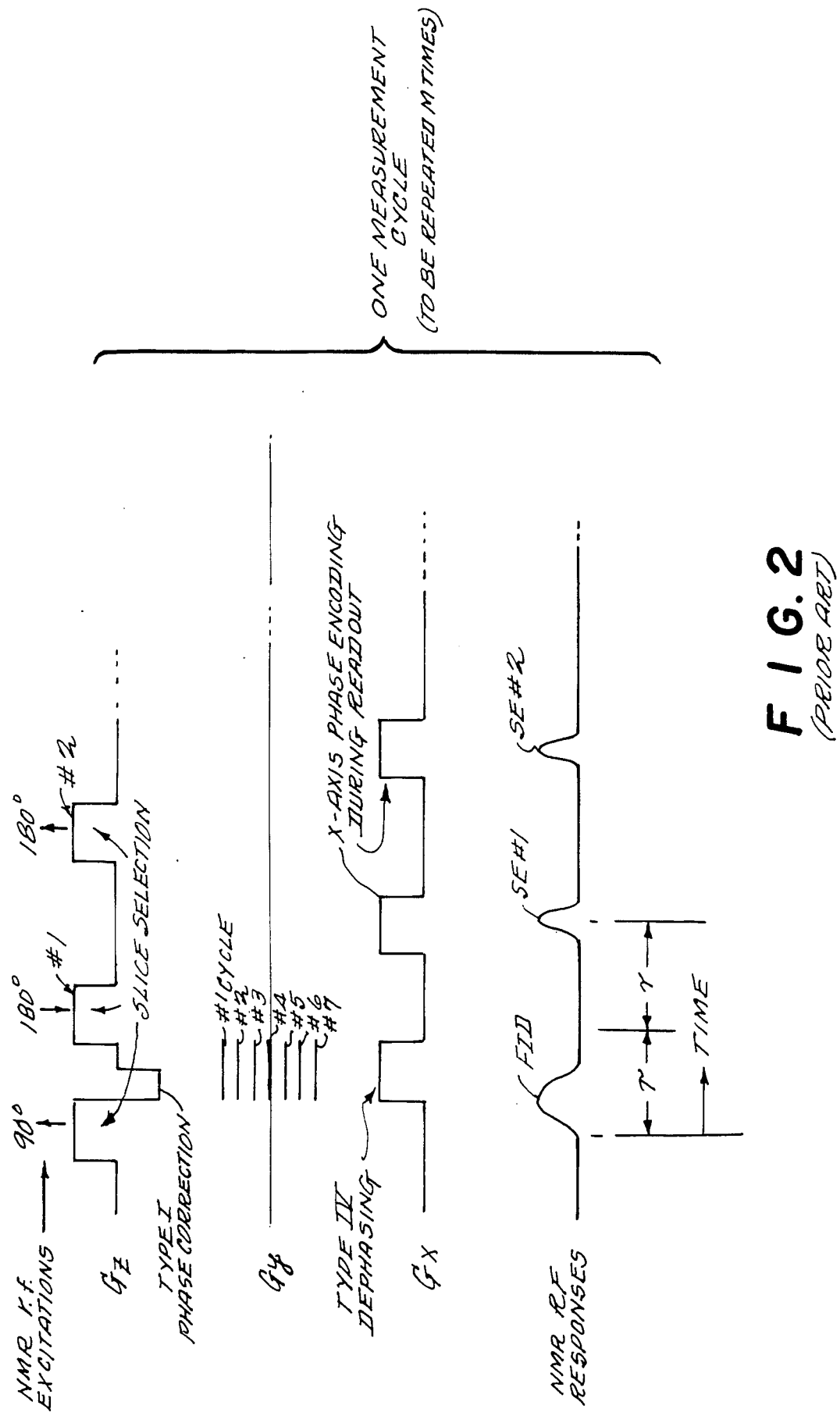
FIG. 2 is a schematic waveform diagram depicting a typical prior art Crooks et al data acquisition procedure.
Figure 3:
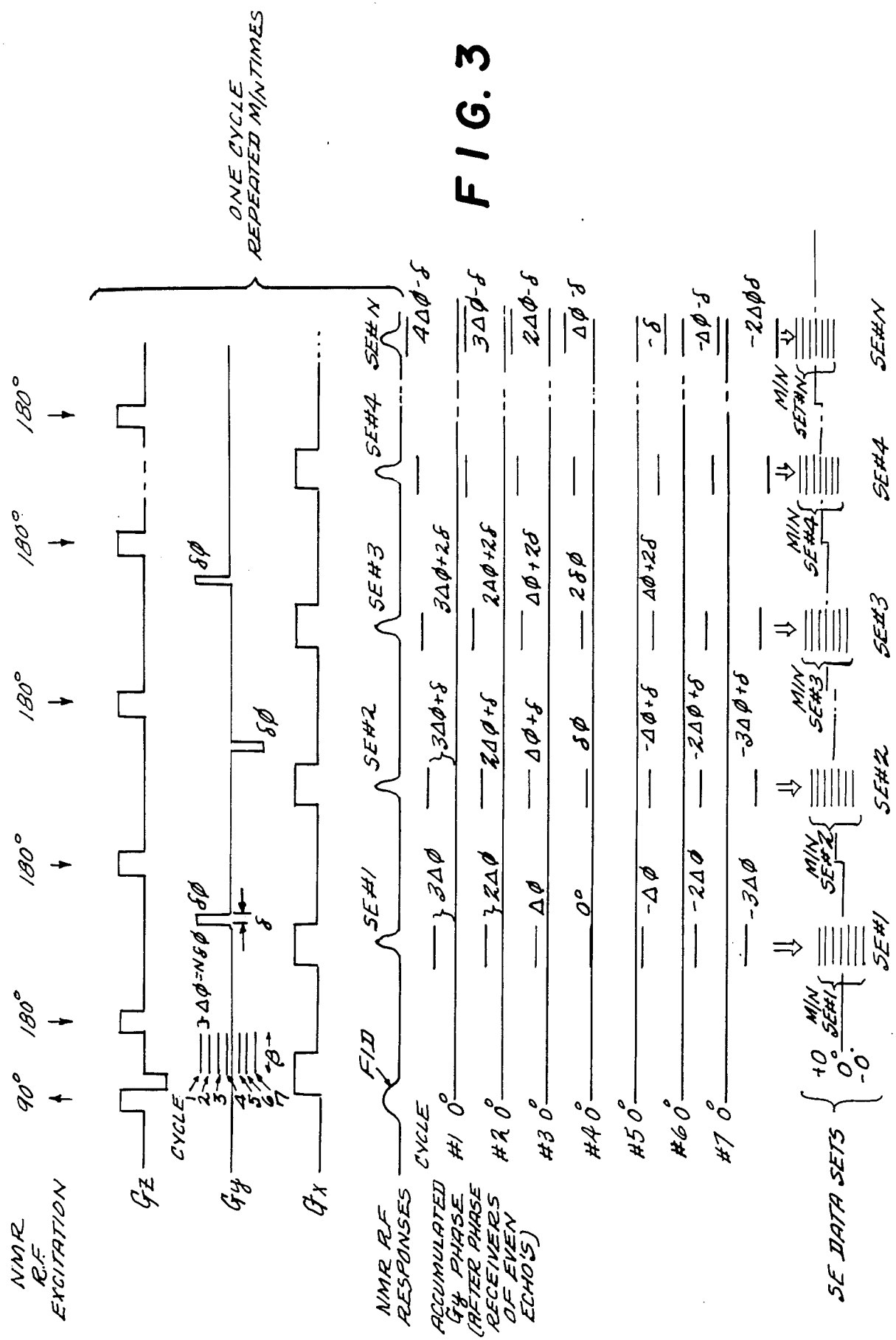
Figure 5:
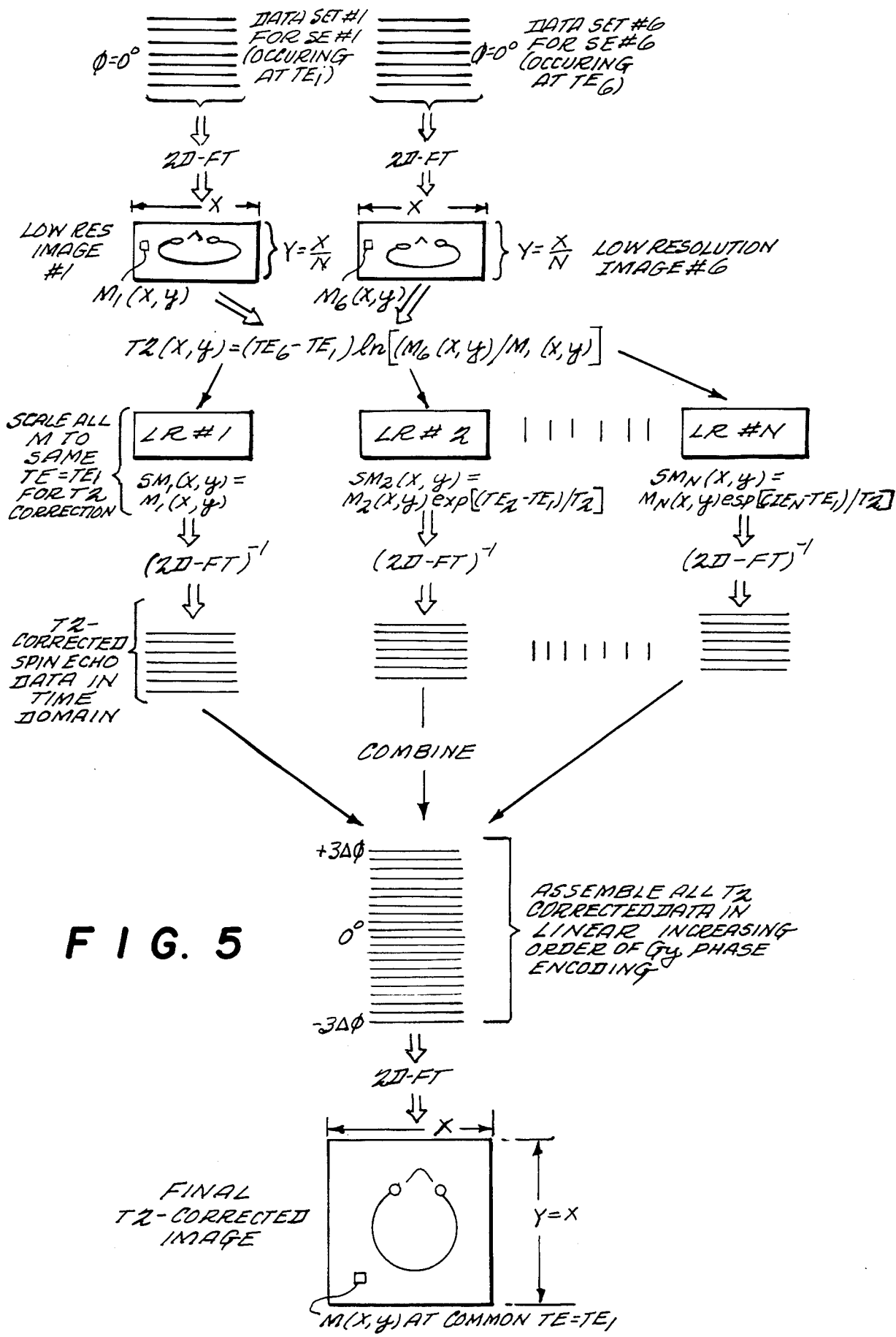
Figure 6:
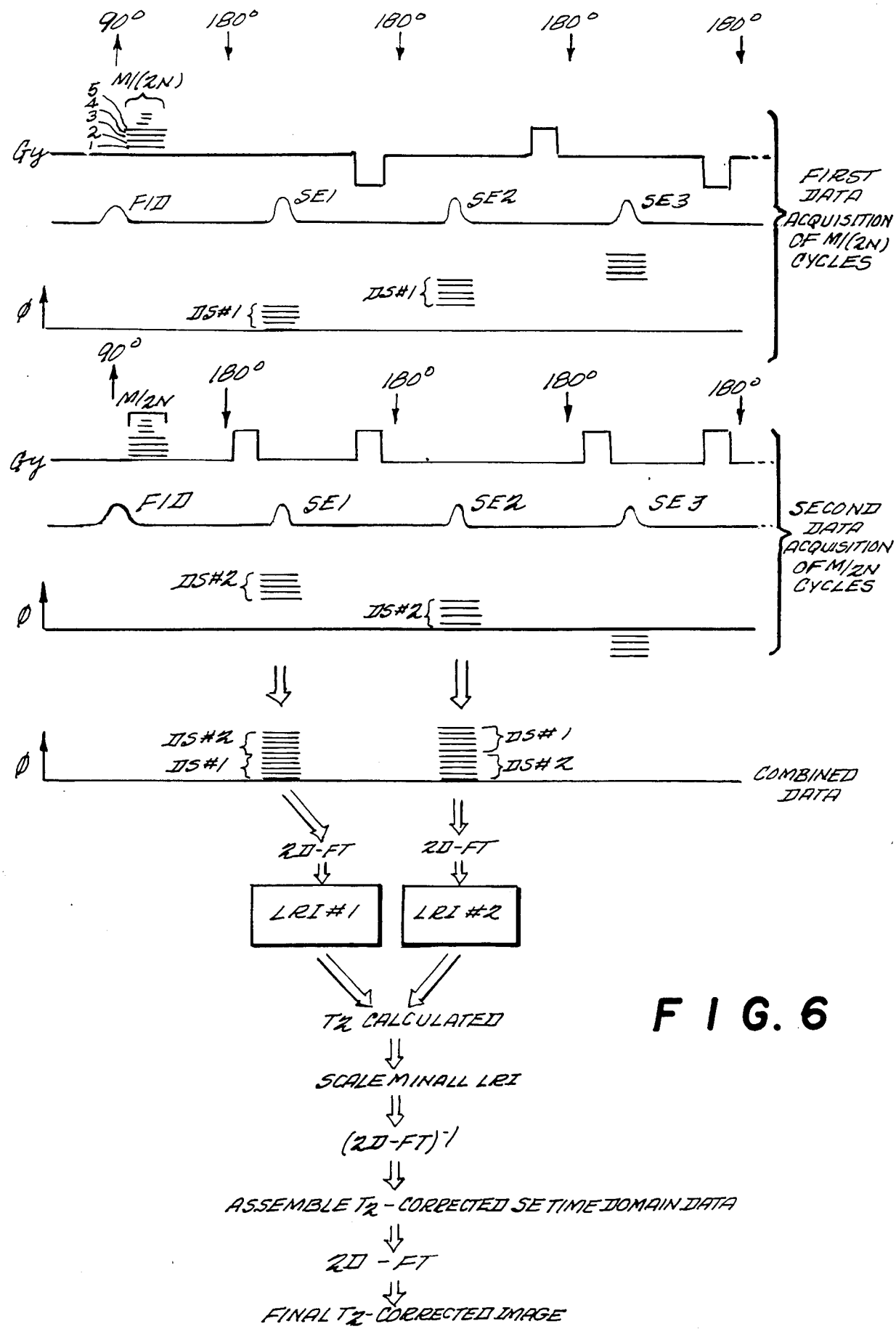

FIG. 2A diagrammatically depicts a type of "ghost" artifact which may be present in imagees made using the prior art technique of FIG. 2;

FIG. 2B depicts an improved $G_z$ gradient pulse sequence which may be used to reduce or eliminate the artifact depicted in FIG. 2A;

FIG. 3 is a schematic waveform diagram depicting a first type of data acquisition procedure in accordance with this invention;

FIG. 3A depicts an alternate to the FIG. 3 embodiment wherein each spin echo signal is divided into parts with some "missing parts" being synthesized by assumed conjugate symmetry relationships;

FIG. 3B is similar to FIG. 3A but depicts the situation where "negative time pulses" are not employed;

FIG. 4 is a schematic waveform diagram depicting a second type of data acquisition procedure in accordance with this invention and also illustrating the manner in which two sets of identical cycle dependent y-axis phase encoded spin echoes may be acquired so as to permit calculation of a T2 parameter for each pixel of a low resolution image;

FIG. 5 is a schematic depiction of one exemplary T2-correction procedure utilizing the data produced by the procedure of FIG. 4;

FIG. 6 is a schematic diagram illustrating yet another data acquisition procedure in accordance with this invention including suitable T2-correction procedures;

FIG. 7 is a photograph of an MRI image produced using the FIG. 4 data acquisition procedure but without any T2 correction thus exhibiting T2-induced artifact; and FIG. 8 depicts another data gathering sequence for effecting T2 correction.

Figure 1:
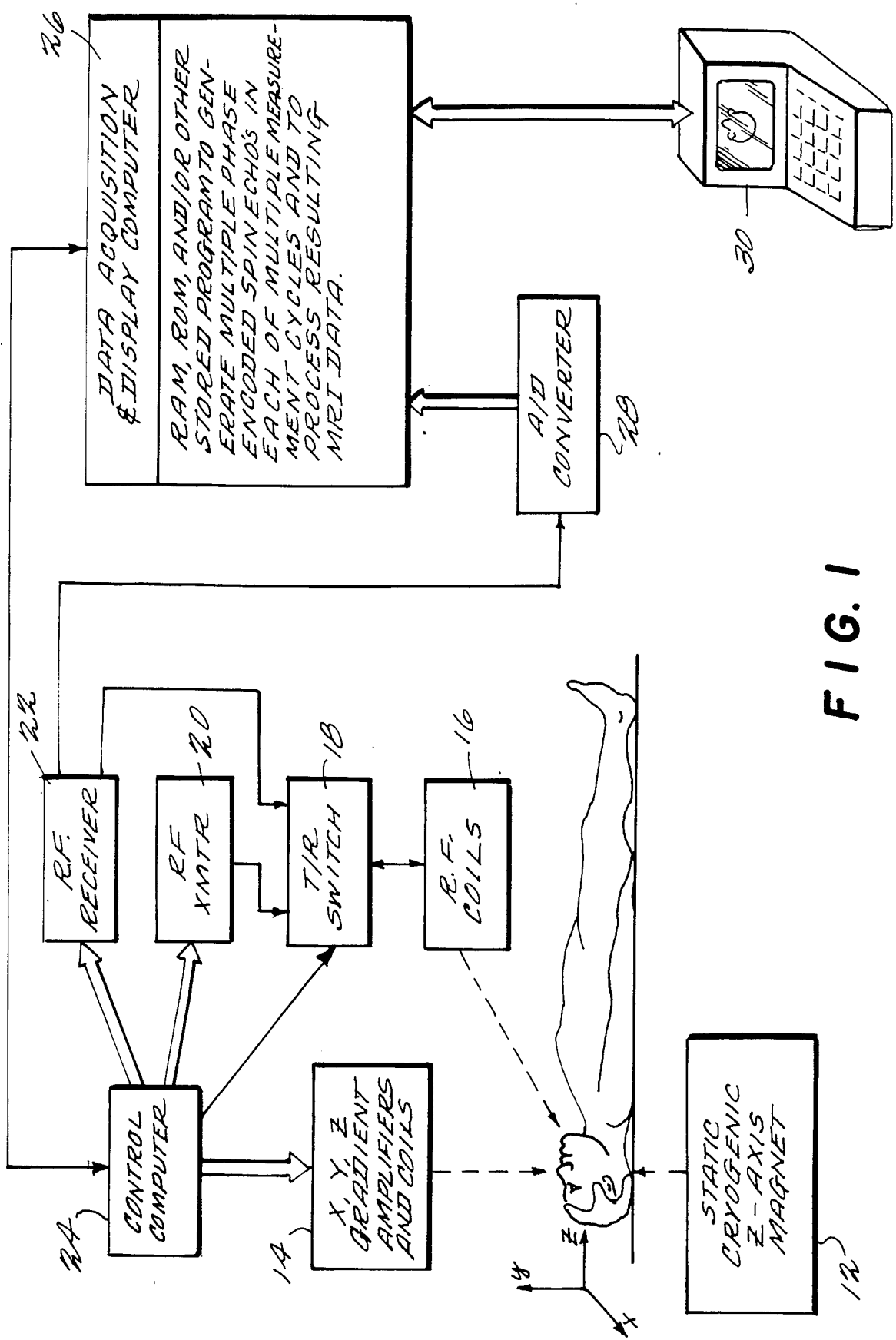
FIG. 1 is a block diagram of a typical MRI scanner system programmed so as to practice the novel data acquisition procedure of this invention.

The novel data acquisition/processing procedure utilized by this invention can typically be achieved by suitable alteration of stored controlling computer programs in existing MRI apparatus. As one example of such typical apparatus, the block diagram of FIG. 1 depicts the general architecture of the Crooks et al system described in more detail in the above-referenced related patents and/or patent applications of Crooks et al.

Typically, a human or animal subject (or other object) 10 is inserted along the z-axis of a static cryogenic magnet which establishes a substantially uniform magnetic field directed along the z-axis within the portion of the object of interest. Gradients may be imposed within this z-axis directed magnetic field along the x, y or z axes by a set of x, y, z gradient amplifiers and coils 14. NMR RF signals are transmitted into the body 10 and NMR RF responses are received from the body 10 via RF coils 16 connected by a conventional transmit/receive switch 18 to an RF transmitter 20 and RF receiver 22.

All of the prior mentioned elements may be controlled, for example, by a control computer 24 which communicates with a data acquisition and display computer 26. The latter computer 26 may also receive NMR RF responses via an analog to digital converter 28. A CRT display and keyboard unit 30 is typically also associated with the data acquisition and display computer 26.

As will be apparent to those in the art, such an arrangement may be utilized so as to generate desired sequences of magnetic gradient pulses and NMR RF pulses and to measure desired NMR RF responses in accordance with stored computer programs. As depicted in FIG. 1, the MRI system of this invention will typically include RAM, ROM and/or other stored program media adapted (in accordance with the following descriptions) so as to generate multiple phase encoded spin echoes during each of multiple measurement cycles and to process the resulting MRI data into a final high resolution NMR image.

FIG. 2 depicts a typical prior art Crooks et al data acquisition sequence. For example, each measurement cycle may be initiated by a 90° NMR RF excitation followed by a 180° NMR RF nutation pulse located $\tau$ later in time and, if desired for signal averaging purposes, followed by subsequent 180° RF nutation pulses (typically distributed at $2\tau$ time intervals). It will be noted that during each RF excitation pulse there is a slice selection $G_z$ magnetic gradient pulse switched "on" so as to selectively excite only the desired "slice" or "planar volume" (e.g. a slice of given relatively small thickness through the object being imaged). During each resulting spin echo NMR RF response, x-axis phase encoding is achieved by applying an x-axis magnetic gradient during the readout procedure (typically each spin echo pulse is sampled every 30 microseconds or so with a digitized value being stored for later processing).

In addition, a cycle-dependent y-axis phase encoding pulse is employed typically having a different magnitude on each measurement cycle. Although only seven measurement cycles are explicitly depicted in FIG. 2, it will be understood that in practice the number of measurement cycles must be equal to the number of desired lines of resolution along the y-axis in the final image. Furthermore, although a generalized case of plural spin echoes in a given measurement cycle is depicted at FIG.

2, since each spin echo signal has common y-axis phase encoding, typically only one or two spin echoes were actually utilized and practiced before that particular measurement cycle was terminated and the corresponding "slice" was allowed to "relax" for a T1 interval or more while other "slices" were similarly addressed so as to obtain their spin echo responses. Typically on the order of hundreds of such measurement cycles are utilized (e.g. so as to obtain enough data to provide hundreds of lines of resolution along the y-axis).

As may be better understood by reading the above referenced related patents, a sequence of M such y-axis phase encoded spin echo signals may be subjected to a two-dimensional Fourier transformation process so as to result in M×M pixel values for a resulting NMR image.

If the Crooks et al sequence of FIG. 2 is used for rapid imaging (i.e., where n=1 SE signal for each necessary data signal and no redundant SE signals with different RF phrases are employed for signal averaging), there may be some "ghost" image artifact as depicted in FIG. 2A. However, I have discovered that by reversing the polarity of each successive slice selective $G_z$ gradient on each 180° RF pulse as depicted in FIG. 2B, such image artifacts are eliminated. These artifacts appear as a rotated low intensity duplication of the object that is superimposed on the image object as depicted in FIG. 2A. Such artifacts may be caused by some regions of nuclei achieving only a 90° flip instead of 180° flip (e.g., those located at the edge of a section profile). Any such nuclei also produce signal in the second and later echo image data. In other words, $90°-\tau-180°-2\tau-180°$ sequence becomes, for these regions of nuclei, a $90°-\tau-90°-2\tau-90°-\tau$ sequence which is analogous to $90°-2\tau-180°-2\tau$ sequence, producing a "stimulated" echo in addition to the desired "Hahn" spin echo. The alternately reversed polarity $G_z$ gradient pulses eliminates these stimulated echoes.

(In performing multi-section imaging with alternating gradient pulse polarities, the RF frequency offsets "hopping" must also have reversed polarity on the negative gradient pulses.) It will be understood throughout the remainder of this discussion, that such alternating $G_z$ polarity gradient pulses may be used, if desired, to eliminate "ghost" image artifact.

Referring now to FIG. 3, it will be seen that to obtain the same amount of data so as to permit a final NMR image having M×M pixels, a given extended NMR measurement cycle need be repeated only M/N times using the novel data acquisition procedure of this invention. First of all, it should be observed that, except for the fact that the length of a given cycle is extended, the NMR RF excitation and z-axis gradient pulses and x-axis gradient pulses are substantially the same as in FIG. 2 (as modified by FIG. 2B, if desired). However, it will now be observed that the y-axis magnetic gradient pulses are considerably different. In particular, between each pair of spin echoes within a train of plural spin echoes on a given cycle, there are incremental $\delta\phi$ y-axis magnetic gradient pulses. Although every other one appears to be of reverse polarity, in actuality they produce cumulative phase effects in the NMR nuclei due to the effect of the interleaved 180° RF nutation pulses. As will be apparent to those skilled in the art, every other spin echo signal is inherently of inverted phase due to the effects of the 180° RF nutation pulse just preceding it. Therefore, to compensate for such effects of the 180° RF nutation pulses used to elicit the spin echo in the first place, the phase of every other spin echo signal must be inverted at some point during signal processing. It is hereinafter assumed, for example, that the phase of all even numbered spin echoes is reversed by simple sign multiplication during digital signal processing.

It will also be observed in FIG. 3 that the cycle dependent y-axis magnetic gradient pulses (e.g. of width $\beta$) are incremented by an amount $\Delta\phi$ equal to $N\times\delta\phi$. To facilitate an understanding of the phase encoding process which occurs on successive spin echo signals elicited during each extended measurement cycle as well as from one measurement cycle to the next, the accumulated spin echo phase magnitude has been line diagrammed for an assumed seven cycles in the lower part of FIG. 3. Thus, starting with the first spin echo in cycle number 1, the relative y-axis phase encoding would be of magnitude $+3\Delta\phi$. The second spin echo signal would have added to that an increment $\delta\phi$—as would each subsequent spin echo of that first cycle. It should be noted that because the first incremental spin echo dependent gradient pulse does not occur until after the first spin echo, there are only n−1 such incremental pulses distributed throughout a given measurement cycle. The Nth $\delta\phi$ increment of phase encoding is effectively added by the cycle-dependent gradient pulse which is incremented by a factor of $N\delta\phi$. (In actual practice, to maintain a more symmtric pulse sequence and thus facilitate realization of the pulse train, an extra $\delta\phi$ pulse may be inserted prior to the first spin echo and the cycle dependent $\beta$ pulse may be correspondingly offset by $2\delta\phi$ so as to compensate threfore.)

After the first measurement cycle has been completed, it can be seen that N spin echo signals have been accumulated, each having successively greater y-axis phase encoding than the last. After a suitable T1 relaxation time, the second cycle will begin with another 90° RF nutation pulse followed by a train of 180° RF nutation pulses. However, on this second cycle, the cycle-dependent y-axis magnetic gradient pulse only has a magnitude of $2\Delta\phi$. Accordingly, the first spin echo of the second cycle will have only this magnitude of y-axis phase encoding while each subsequent spin echo captured during the second cycle will have an incrementally $\delta\phi$ greater degree of y-axis phase encoding as should now been apparent and as is depicted in FIG. 3.

It should also be noted that in the example of FIG. 3, the "middle" measurement cycle number 4 actually has zero cycle-dependent y-axis phase encoding while subsequent cycles have negative relative values of y-axis phase encoding.

If the M/N spin echoes number 1 (i.e. those collected at a time of echo $TE_1$) are compiled, they will result in a spin echo data set number 1 as depicted as the lower portion of FIG. 3. Similarly, the data occurring at each time of echo can be compiled into separate data sets as shown in FIG. 3.

It should also be appreciated that if all of the spin echo data occurring at all TE in FIG. 3 is compiled into one set, it may be arranged in an order which will provide M spin echoes having a linear progression of increasing y-axis phase encoding (e.g. an increment $\delta\phi$ between each successive spin echo). Except for T2-induced artifact, this composite set of M spin echo data might be utilized directly in a two-dimensional Fourier transformation to produce an M×M pixel NMR image. However, because the spin echo signals occur at different TE within a given measurement cycle, they will exponentially decrease in accordance with the T2 parameter. Therefore such an NMR image made using the raw collected spin echo data can be expected to have T2-induced artifact (e.g. a general blurriness or fuzziness may be noted) as shown in the photograph of FIG. 7.

To remove the T2-dependency in the collected spin echo data, one must somehow obtain a measure of T2. While various approximate corrections could be devised (e.g. using average T2 factors or the like), it is preferred to obtain sufficient data to actually calculate T2 for each image pixel (—or at least for the neighborhood about each pixel) so that a more accurate compensation for the T2 artifact may be realized. There are probably an infinite variety of techniques that could be utilized for obtaining the requisite T2 data with which to make the compensation. However, one technique is to employ a spatial y-axis gradient pulse sequence so as to produce two sets of identical cycle dependent y-axis phase encoded spin echo data.

One such modified procedure is depicted at FIG. 4. Here, it will be seen that the cycle dependent $G_y$ pulses all occur in a positive direction and are offset by $+2\delta\phi$ from the zero axis. For pulse symmetry, an extra $\delta\phi$ pulse may normally be inserted after the first 180° RF pulse and before the first spin echo as shown by dotted lines. However, here, a negative increment of $-4\Delta\phi$ has been inserted between the first and second echoes of each cycle. As a result, after the first spin echo of each cycle has been collected, the remaining train of spin echoes suffer an increment of $-4\delta\phi$ y-axis phase encoding after which they are permitted to increment in a positive direction as with the procedure of FIG. 3. As a result, eventually (e.g. at the time of spin echo number 6 in FIG. 4), one will obtain a spin echo having the same y-axis phase encoding as was associated with the first spin echo. Accordingly, when the M/N spin echoes for $TE_1$ and $TE_6$ are compiled, they will result in two sets of identical cycle dependent y-axis phase encoded echoes (with phases centered about the same assumed "zero" point as is also depicted in FIG. 4).

Although there are only M/N spin echoes in each such sets of data, they may nevertheless be used in a two-dimensional Fourier transformation process to provide a low resolution image (e.g. there will only be M/N lines of resolution along the y-axis) as is schematically depicted in FIG. 5. Thus, as depicted in FIG. 5, data set number 1 and data set number 6 may each be utilized in a two-dimensional Fourier transform process to produce a "squashed" low resolution image (LRI). Each "pixel" in this low resolution image will have some characteristic magnitude at a given x,y coordinate as also depicted in FIG. 5. Since it is known that data for the first low resolution image occurred at echo occurrence time $TE_1$ and since it is also known that the data for image number 6 occurred at echo occurrence time $TE_6$, a straightforward logrithmic calculation may be utilized for calculating the T2 parameter at each x,y pixel site in the low resolution images (as also depicted in FIG. 5).

Once the actual T2 parameter has thus been derived for each pixel in a low resolution image of this type, it may be utilized for scaling the magnitude of similar pixels in similar low resolution images for all data sets corresponding to each of the various time of echo occurrences $TE_1-TE_N$. Subsequent inverse two-dimensional Fourier transformation of the now T2-corrected low resolution spatial domain images will result in T2-corrected sets of time domain spin echo data for each of the time of echo occurrences $TE_1-TE_N$ as also depicted in FIG. 5. Subsequently, such T2-corrected time domain spin echo data is reassembled so as to provide a linear progression of y-axis phase encoded spin echo signals which may then be subjected to conventional two-dimensional Fourier transformation to result in a final T2-corrected image having full M line resolution in both the x-and y-axis dimensions as also depicted in FIG. 5.

Another technique for achieving sufficient data to calculate T2 and thus make T2 corrections is depicted at FIG. 6. Here, relatively larger spin echo-dependent y-axis gradient pulses $\delta$ are used and relatively smaller cycle dependent y-axis gradient pulses $N\Delta = \delta$ are utilized (this time starting with zero or some initial offset of cycle-dependent phase encoding for the first cycle and then progressively increasing for each successive cycle). Accordingly, after a first complete data acquisition procedure of M/2N cycles, one may compile at $TE_1$ a sequence of spin echo signals having progressive y-axis phase encoding which starts from "zero" and works up to a magnitude which corresponds to the maximum degree of cycle-dependent phase encoding. Then, in an second data acquisition sequence of M/2N cycles, an extra y-axis magnetic gradient pulse is inserted before the first spin echo thus producing a second sequence of spin echoes occurring at $TE_1$ but starting from an increment of (M/2N) $\delta\phi$. Similarly, the spin echo signals compiled from $TE_2$ are shifted so as to occupy positions in the y-axis phase encoding plane equivalent to those occupied at $TE_1$ in the first data acquisition procedure.

Note that, as an example, the odd-numbered $G_y$ pulses appear after a 180° RF pulse while the even-numbered $G_y$ pulses appear before their respective 180° RF pulses. In this way, the $G_y$ pulses may all have the same polarity. As will be appreciated, $G_y$ pulses may be disposed or polarized in such differing fashions within a single sequence, if desired.

When the collected spin echoes of the first and second data acquisition procedures are compiled (as shown at the middle part of FIG. 6), they provide two substantially identical sets of data except for having occurred at different time of echo occurrences $TE_1$ and $TE_2$. Accordingly, when these two data sets are used to produce low resolution images by two-dimensional Fourier transformation (as depicted in FIG. 6), it is also possible to calculate T2 for each pixel of the low resolution image (in the manner as already depicted at FIG. 5). Similarly, the scaling of the magnitude of pixels in all low resolution images so as to relate to a common TE value followed by inverse Fourier transformation of each low resolution image (LRI) is similar to that already depicted in FIG. 5. The further assembly of the resulting T2-corrected spin echo time domain data followed by a further larger scale two-dimensional Fourier transformation also results in a final T2-corrected NMR image in the FIG. 6 which is the same as that also depicted at FIG. 5 for this portion of the procedure.

A third method of acquiring data is possible in a single train of echoes in which the first two images are used in calculating the T2 map—but with greater accuracy for *short* T2 components (most descriptive to the image) than using the first and last echo (good for *long* T2 since $\Delta TE \cong 5TE$). This further technique is depicted in FIG. 8.

Using only positive phase encoding on third and subsequent echoes, SE1 and SE2 will have the same phases (however, they have different T2 weighting). Conjugate synthesis is then used to produce $-\phi$ SE phase encoded data so that low resolution images LRI#1 and LRI#2 can be made for T2 calculations. A T2 correction is then performed on all actually acquired data, before a final conjugate synthesis of $-\phi$ SE data is performed to produce a full set of data for deriving the final full resolution image, thus reducing data acquisition time by one half.

Another method of obtaining signals of different $\phi$ is shown in the sequence diagram of FIG. 3A, which differs from FIG. 3 in that the spin echo is divided into two parts for additional phase encoding. In general, the second half of the echo has a different $\phi$ than its complementary first half. This $\Delta\phi$ is achieved with magnetic gradient pulses G2y and G4y. However, it is equally important to apply what is termed a "negative time pulse", G3x, at some temporal point between G2x and G4x. In effect, G3x, reverses the focusing of the individual spins so that they are defocused to an earlier time than that of the peak signal. This defocusing permits the G4x pulse to be applied for gradient settling, and then for G5x to be applied during the signal readout period which resamples the peak of the echo. Without the negative time pulse, the signal will have focused beyond the peak at the beginning of G5x or the second readout period (as depicted in FIG. 3B).

By conjugate synthesis of the "missing half" of each spin echo, complete echo data is obtained. In this way, twice as many phase encoded echoes are produced in each cycle of the sequence.

Thus, to recap, in the FIG. 3 procedure, a small phase increment, $\delta$ is applied on each of $n-1$ echoes in the same train, and a larger phase increment equal of $N\delta$ is applied to each new cycle of the complete data acquisition sequence. A multiple spin echo pulse train is produced with a 90° RF pulse to produce an FID signal. At time $(2n-1)\tau$ later 180° RF pulses are applied to refocus the FID signal at times $(2n)\tau$ and thus to produce spin echo signals. Slice selective $G_z$ gradient pulses are applied on the z-axis of a three Cartesian coordinate system. On a second orthogonal x-axis, a readout $G_x$ gradient is applied at each at each time of spin echo TE to produce spatial encoding of the Fourier transformed signal on the same x-axis. On the third independent Cartesian y-axis multiple pulsed gradients are applied, as shown, at some temporal point before each echo subsequent to the first. All spin echo-dependent gradient pulses have the same strength and pulse duration.

The $G_y$ gradient pulses which encode the even numbered echoes have opposite polarity compared to the gradients on odd numbered echoes. Although the net magnitude of phase accumulated at each spin echo (SE) is linearly increased at each consecutive echo, the sign of the even echo phase change is always opposite the sign of the odd echo phase change due to the phase reversal effect of the intervening 180° RF pulse. By computationally reversing the phase of either the odd numbered echoes or the even numbered echoes, the accumulated y-axis phase encoding increases linearly.

Any number of echoes, N can be acquired with linear phase encoding gradient pulses, however, the T2 decay of later echoes occurring at later echo times TE ultimately limits the number of useful echoes. To acquire all M phase projections needed for a specified M×M spatial resolution and image field of view, the pulse train is repeated M/N times. On each additional cycle of the complete acquisition sequence a cycle-dependent $G_y$ gradient pulse before the first spin echo signal is changed by increment of $N\delta$ where $\delta$ is the phase accumulated during each of the consecutive echo-dependent gradient pulses. By not acquiring all the phase encoded signals in a single cycle, longer gradient pulses can be used in the same time and the need for extremely fast gradient switching is eliminated. Consequently, larger gradient coils, useful for whole body imaging, can be used for this fast spin echo imaging (the even faster echo planar imaging of Mansfield et al necessitates smaller gradient coils to reduce the effects of coupling to the magnet immediately surrounding the coils).

One potential problem with the present fast spin echo image results from the fact that T2 decay modulates the amplitude of different phase encoded echoes. Thus, different frequencies are weighted by T2 decay and the image is modulated by the reoccurring T2 exponential decay curve (see T2 artifact as shown in FIG. 7).

One process of correcting the data to a common T2 value is shown in FIG. 6. The cycle dependent changes in phase permit the normalization of signals with different amounts of T2 decay, since there are M/N measurements with the same value of T2 decay. For this purpose, a larger increment of echo-dependent phase encoding $G_y$ gradient is used between each echo pair and a smaller increment of $G_y$ phase change is used on each successive cycle. Assuming that the spin-spin relation obeys a monoexponential decay curve, plural measurements at two or more TE can be used to determine the T2 parameter at different spatial locations. This process requires one second set of equivalent phase encoded data to be acquired (e.g. with the "centered" zero phase encoded signals) at a different TE than the first echo. Using only the cycles occurring at the first echoes, 2D-FT produces a 2D spatial image with the y-axis resolution (i.e. the phase encoded dimension) equal to 1/N the resolution of an image reconstructed from all M echoes at N different times. An image is made with the nth set of data, but using only the nth echo of each cyle for data. Using the two resulting low resolution images, the T2 parameter at each spatial element can be calculated with a mono-exponential fitted to the two magnitude measurements at the same pixel location.

Similarly, low resolution images at all echo times $TE_1-TE_N$ can be made, each having different frequency encoding. The T2 parameters determined at each x,y coordinate are used to individually weight the magnitudes of each of the N low resoltion images to the same extrapolated or interpolated point on the exponential T2 decay curve. The complete N sets of corrected data is then inverse-transformed $(2D-FT)^{-1}$, and the total time domain data (M spin echoes) is then recompiled. A final 2D-FT of the total T2-corrected M spin echo data gives an image at the chosen common TE. This image has N times higher spatial resolution on the phase encoded y-axis than the lower resolution images created on the first pass of the 2D-FT.

A different process of removing the T2 decay modulation envelop also requires two or more measurements of the same phase encoded spin echo (SE) signal at different echo times TE. By measuring the decay of the time domain signal amplitude, or in its one dimensional FT projected image, the T2 parameters can be approximately determined and used to synthesize signals, all effectively translated to the same TE. (This method would only correct for the averaged T2 decay at different TEs, and therefore the correction procedure is less spatially accurate. Its advantage is, however, that it requires much less computation time than the earlier-described method which involves N 2D−FTs, N inverse 2D−FTs, one larger 2D−FT, and logrithmic calculations on T2 at each pixel in a 2D array.)

A third method of T2-correction which is even less demanding on computer computation time, requires that signals of the same phase encoded value, but having differing TE values, are averaged together. In this way, the T2 decay function will more equally affect all the phase encoded signals, and the resulting image represents SE signal at an average TE.

Some experiments have been conducted using the new data acquisition procedure and the results are now presented.

Consider a spatial distribution of nuclei I=½ in a magnetic field $H_o$ in the Z-direction on which is imposed a linear gradient G Gauss·cm$^{-1}$ to produce a field dependence on position. The mean precession frequency of the nuclei in absence of gradient is $\omega_o = -\gamma H_o$ where $\gamma$ is the gyromagnetic constant. During the period of pulsed gradient applied along the y-axis, the procession phase angle of the nuclei is increased, $$\Delta\phi = \int_o^\delta \gamma G_y y dt = \gamma G_y y m$$

where the precession phase angle, $\phi$, is defined in a reference frame rotating at $\omega_o$. As shown in the gradient pulse sequence diagrams, $G_y$ pulses are applied every $2\tau$ interval. The 180° RF pulses nutate the spins and change the sense of the net phase existing prior to the pulse. If there is a phase shift of $\Delta\phi$ before the second 180° RF pulse, then immediately following the nutation process, $\Delta\phi(4\tau)=\Delta\phi(3\tau)$. To encode a constant net accumulation of phase shifts at successive echoes, the polarity of alternate gradient pulses is changed, so that $$\Delta\phi(n2\tau) \sum_{n=1}^{N_E} (-1)^{n+1} n\gamma G_y y$$

where n denotes the nth successive echo in the train. In these experiments, the total number of echoes in the train, $N_E$, is limited to 8 with a 14 msec interval due to the time required for the switching gradient pulses (msec) and for radio frequency (RF) irradiation. The RF pulses are modulated by a truncated sinc function which acting with a slice selective gradient, $G_z$, has a frequency spectrum matching the resonant frequencies of nuclei located within a planar volume. The pulse sequence was iteratively repeated 16 times with different incremental gradient strengths $G^1_y$ during cycle-dependent pulse duration, $\beta$, to change the phase at all n echoes $$\Delta\phi(c,n2\tau) = \gamma_y \sum_{c=1}^{N_c} \sum_{n=1}^{N_E} (-1)^{n+1}[nG^2_y\delta + cG'_y\beta]$$

where c is the cycle number of the pulse sequence iteration of total cycle number $N_c$. The phase interval of each cycle equals a fraction of the phase increment accumulated by each consecutive echo, $G_y^1 = G_y^2/N_c$ so that the total set of the $N_c \cdot N_E$ echoes has a single uniform increment of phase difference. In practice, the temporally consecutive echoes are regrouped to provide a data set having a linear increase in phase before applying a Fourier transform. Also note that spatial resolution on the x-axis is produced by the presence of $G_x$ during the spin echo formation time (centered at n·2τ), which imposes a linear dependence between the resonance frequency of nuclei and their position on the x-axis. The image, which is the density distribution of nuclei, $\rho(x,y)$, is reconstructed from these spin echo signals, $\overline{M}(t)$, by 2D-Fourier transformation, $$\rho(x,y) =$$

$$\frac{1}{2\pi} \int_{-\infty}^{+\infty} \int_{-\infty}^{+\infty} \overline{M}(\phi,\tau)e^{-j\gamma(\phi y + G_x t x)} \overline{H}(\phi) d(\gamma\phi) d(\gamma G_x t)$$

where $H(\phi) = e^{-nTE/T2}$ and TE is the time of the echo formation. The modules or magnitude of $\rho(x,y)$ is displayed as the actual intensity of the digital image. The spin echo signals are detected in quadrature for determination of phase, and converted to digital data for computer image processing.

If one assumes that the signal magnitude of the echoes does not decay significantly, (T2 very large), then $H(\phi)$ can be set to unity. The echo signal modulation due to magnetic field inhomogeneties, T2*, is eliminated by the 180 RF nutation pulse.

According to the Convolution theorem, the Fourier transform of $\overline{M}(\phi,t)\cdot\overline{H}(\phi)$ produces the true spin density distribution convolved with a point spread function, and the added effect of discrete sampling of the T2 decay curve produces image artifacts as well as spatial blur. This is apparent in the cross-sectional image of the human head of FIG. 7. The image's inplane pixel dimension is 1.4 mm × 1.4 mm, with a section thickness of 10 mm made with TR =0.5 seconds and acquired in a 5 section multi-image mode. The total image acquisition time was 8 seconds. A similar experiment (not shown) produced images of the head at TR=2 seconds in a 20 multi-section acquisition mode taking 32 seconds.

A novel method of removing the horizontal line artifacts and other T2 decay effect from the image is especially applicable since the data is not acquired at a single TE. Two of these images with different TE can be used to produce a spatial map of T2 which is thereafter used to normalize all data to the same effective TE. A modification of the pulse sequence may then be used to produce two sets of identical cycle dependent phase encoded echoes with phase centered on an assumed $\phi=0$. For example, by centering the cycle dependent gradient pulses on $G^1_y=0$, removal of $\delta G^1_y$ immediately prior to the second 180° RF pulse, and placing a pulse of area $-4\delta G^1_y$ immediately prior to the second 180° RF pulse, two sets of identically phase encoded echoes are defined at times $2\tau$ and $6\tau$. The acquisition of an additional echo is required to maintain the maximal accumulated net phase and corresponding spatial resolution.

$$T2(x,y) = \sum_{x=1}^{N_x} \sum_{y=1}^{N_c} 4\tau/\ln(\rho_1(x,y)/\rho_2(x,y))$$

Spatial resolution is reduced by a factor of $1/N_E$ on the phase encoded dimension in these images since the net phase does not accumulate on successive echoes. The image field of view remains inversely proportional to the cycle dependent phase increment $\beta G_1{}^y$ chosen to prevent aliasing. Consequently, the T2 map is made with T2 averaged in the phase encoded axis, with no averaging of spatial resolution on the x-axis encoded independently by $G_xT2(x,y)$ is used to numerically scale the similarly 2-D Fourier transformed data taken at other single echo times, so that the moduli of the complex numbers in each pixel are extrapolated to the same echo time (the choice of TE is arbitrary). Each such scaled complex z data set is inverse Fourier transformed and the T2 normalized time domain data is reshuffled into a single data set which is $N_E$ times larger. A final forward Fourier transform of the T2 normalized data produces the image $\rho(x,y)$ deconvolved from $H(\phi)$. It should be noted that although the image dependence on T1 is determined by the TR of data acquisition, the T2 map can be used to scale data to several different TE values for synthesis of multiple spin echo images which have known clinical utility.

In the above described acquisition method, redundant data can be averaged for increased S/N. In general, the image S/N is inversely proportional to the frequency bandwidth of the signal since decreased bandwidth permits a narrower low pass filter setting in the receiver system. Therefore, the S/N is proportional to the square root of the sampling time which is several times longer estimated 12 times longer with this method than in an echo planar experiment with similar late echo time.

While only a few presently preferred exemplary embodiments of this invention have been described in detail above, those skilled in the art will recognize the fact that many variations and modifications may be made in these exemplary embodiments while yet retaining many of the novel features and advantages of this invention. Accordingly, all such modifications and variations are intended to be included within the scope of the appended claims.

What is claimed is:

1. A method for acquiring NMR image data from an object, said method comprising the steps of:
   eliciting and recording plural NMR spin echoes from a selected slice of the object while encoding a first dimension of spatial information therein by imposing a magnetic field gradient $G_x$ along an x-axis dimension during readout of the recorded spin echo signals;
   said plural spin echoes being elicited in each of plural acquisition cycles, each of which cycles also elicits a train of plural spin echoes by exciting nuclei within said selected slice with a first NMR rf signal pulse followed by a train of 180° NMR rf signal pulses;
   imposing a cycle-dependent magnitude of magnetic field gradient $G_y$ along a y-axis dimension at some time during each cycle to achieve spatial phase encoding along said second dimension; and
   imposing a spin-echo-dependent magnitude of magnetic field gradient $G_y$ along said second dimension prior to the occurrence of at least some spin echo signals in a given cycle so as to achieve further degrees of y-axis phase encoding within different spin echo signals in a given cycle.

2. A method as in claim 1 further comprising the steps of:
   compiling said recorded spin echo data in a linearly monotonic order of spatial y-axis phase encoding; and
   performing a two-dimensional Fourier transformation process on said compiled data to produce an NMR image.

3. A method as in claim 1 wherein both said imposing steps are performed to provide at least two sets of equivalent y-axis phase-encoded spin echo signals except for having been recorded at two respective different temporal times of occurrence within each cycle and thus being subject to differing T2 dependencies, and further comprising the steps of:
   deriving the value of T2 for the neighborhood of each NMR image pixel;
   correcting the recorded time-domain spin echo data to substantially reduce such T2 dependency therein; and
   constructing a final NMR image using the T2-corrected spin echo data.

4. A method as in claim 3 wherein said deriving step comprises:
   constructing at least two low resolution NMR images by two-dimensionally transforming each of said two sets of equivalent data; and
   deriving a T2 value for pixel sites therein based on an assumed mono-exponential T2 dependence for nuclei in the corresponding elemental portion of the object being imaged.

5. A method as in claim 4 wherein said correcting step comprises:
   also constructing low resolution NMR images for other sets of spin echo data having common times of spin echo occurrence;
   scaling the magnitude of resulting pixel values in each said low resolution NMR image using the corresponding derived T2 value so as to substantially reduce T2 dependence; and
   inverse Fourier-transforming each of the thus-scaled low resolution NMR images to produce T2-corrected time domain spin echo signal data.

6. A method as in claim 5 wherein said constructing a final NMR image step comprises a two-dimensional Fourier transformation of the T2-corrected time domain spin echo signal data arranged in a linearly monotonic sequence of y-axis phase encoding.

7. A method of acquiring a set of M spin echo NMR responses from an object to be imaged, each having a respective degree of phase-encoding along a predetermined coordinate axis which incrementally changes from one spin echo response to the next, said method comprising the steps of:
   (a) eliciting a train of N spin echo signals from a selected slice of said object and recording corresponding digital data representing same;
   (b) imposing a first incremental phase change $\delta\phi$ in at least some said spin echoes by applying at least one magnetic gradient pulse directed along said predetermined coordinate axis between occurrences of at least some of said spin echoes;
   (c) imposing a second incremental phase change $n\Delta\phi$ in at least some of said spin echoes by applying at least one additional magnetic gradient pulse directed along said predetermined coordinate axis at least once during said eliciting step (a);
   (d) repeating steps (a), (b) and (c) at least M/N times while incrementing the value of $n\Delta\phi$; and
   (e) compiling the resulting spin echo signed in an order wherein the incremental changes in phase encoding along said predetermined coordinate axis progressively changes monotonically.

8. A method as in claim 7 wherein, prior to said compiling step, the recorded spin-echo time domain signals are corrected for NMR T2 dependency by the following steps:

constructing by 2D—FT N low (M×M/N) resolution NMR images using the M/N spin echoes occurring at each time of echo occurrence TE$_1$ through TE$_N$;

deriving the T2 NMR parameter for each pixel of such low resolution NMR images using the pixel values from at least two of said low resolution NMR images;

scaling the pixel values of all N of the low resolution images using the derived T2 values so as to substantially reduce T2 dependency;

inverse 2D—FT transforming all N of said low resolution images so as to provide M spin echoes in the time domain corrected for T2 artifact; and using such T2 corrected time domain data in said compiling step (e).

9. A method as in claim 8 further comprising:

(f) constructing by 2D—FT a high M×M resolution NMR image using the M compiled T2-corrected spin echo signals.

10. A method as in claim 7 wherein $\Delta\phi = N\delta\phi$.

11. A method as in claim 7 where in $N\Delta\phi = \delta\phi$.

12. A method as in claim 7 of wherein said second incremental changes $\Delta\phi$ are offset by a predetermined magnitude from zero.

13. An MRI method for rapidly acquiring a set of phase encoded NMR spin echo signals for whole body imaging, said method comprising the steps of:

(a) eliciting and recording a train of N NMR spin echo signals from a predetermined section of a whole body, said spin echoes occurring at respective times TE$_1$—TE$_N$ and having respectively associated incrementally changed phase encoding along a predetermined dimension;

(b) repeating step (a) plural times while effecting additional increments of said phase encoding;

(c) correcting said recorded spin echo signals for T2 decay effects using recorded spin echo signals occurring during at least two different times of echo occurrence TE;

(d) compiling the recorded and T2-corrected spin echo signals into a sequence of signals having monotonically changing encoded phase shifts; and (e) constructing an NMR image by two-dimensional Fourier transformation of the thus recorded, T2-corrected and compiled spin echo signals.

14. An MRI method as in claim 13 wherein said spin echo signals are sampled, digitized and recorded in digital form; wherein step (b) comprises repeating step (a) M/N times; and wherein step (c) comprises:

performing N two-dimensional Fourier transformations, one for each group of M/N spin echoes produced at each time of echo occurence TE$_1$—TE$_N$; to produce N low resolution images of resolution M×M/N;

deriving the T2 NMR parameter value associated with each pixel using recorded spin echo data from at least two different times of echo occurrence TE;

scaling the magnitude of the pixels in said N low resolution images to a common TE value;

performing N inverse two-dimensional Fourier transformations, one for each of the scaled low resolution images to thereby provide T2-corrected time-domain spin echo signal data for use in steps (d) and (e).

15. An MRI method as in claim 14 wherein step (a) is performed using an increment $\delta\phi$ of phase encoding between each successive spin echo of a given train of spin echoes and step (b) is performed using an initial additional increment of $n\Delta\phi$ additional phase encoding prior to each said train, where n is an integer.

16. An MRI method as in claim 15 wherein $\Delta\phi = N\delta\phi$.

17. An MRI method as in claim 15 wherein $N\Delta\phi = \delta\phi$.

18. An MRI method as in claim 15 wherein said additional increments of phase encoding are all of non-zero magnitude.

19. Apparatus for acquiring NMR image data from an object, said apparatus comprising:

means for eliciting and recording plural NMR spin echoes from a selected slice of the object while encoding a first dimension of spatial information therein by imposing a magnetic field gradient $G_x$ along an x-axis dimension during readout of the recorded spin echo signals, said plural spin echoes being elicited in each of plural acquisition cycles, each of which cycles also elicits a train of plural spin echoes by exciting nuclei within said selected slice with a first NMR rf signal pulse followed by a train of 180° NMR rf signal pulses;

means for imposing a cycle-dependent magnitude of magnetic field gradient $G_y$ along a y-axis dimension at some time during each cycle to achieve spatial phase encoding along said second dimension; and means for imposing a spin-echo-dependent magnitude of magnetic field gradient $G_y$ along said second dimension prior to the occurrence of at least some spin echo signals in a given cycle so as to achieve further degrees of y-axis phase encoding within different spin echo signals in a given cycle.

20. Apparatus as in claim 19 further comprising:

means for compiling said recorded spin echo data in a linear monotonic order of spatial y-axis phase encoding; and means for performing a two-dimensional Fourier transformation process on said compiled data to produce an NMR image.

21. Apparatus as in claim 19 wherein both said means for imposing provide at least two sets of equivalent y-axis phase-encoded spin echo signals except for having been recorded at two respective different temporal times of occurrence within each cycle and thus being subject to differing T2 dependencies, and further comprising:

means for deriving the value of T2 for the neighborhood of each NMR image pixel;

means for correcting the recorded time-domain spin echo data to substantially reduce such T2 dependency therein; and means for constructing a final NMR image using the T2-corrected spin echo data.

22. Apparatus as in claim 21 wherein said means for deriving comprises:

means for constructing at least two low resolution NMR images by two-dimensionally transforming each of said two sets of equivalent data; and means for deriving a T2 value for pixel sites therein based on an assumed mono-exponential T2 dependence for nuclei in the corresponding elemental portion of the object being imaged.

23. Apparatus as in claim 22 wherein said means for correcting comprises:

means for also constructing low resolution NMR images for other sets of spin echo data having common times of spin echo occurrence;

means for scaling the magnitude of resulting pixel values in each said low resolution NMR image using the corresponding derived T2 value so as to substantially reduce T2 dependence; and means for inverse Fourier-transforming each of the thus-scaled low resolution NMR images to produce T2-corrected time domain spin echo signal data.

24. Apparatus as in claim 23 wherein said means for constructing a final NMR image comprises means for performing a two-dimensional Fourier transformation of the T2-corrected time domain spin echo signal data arranged in a linear monotonic sequence of y-axis phase encoding.

25. A method for acquiring NMR image data from an object, said method comprising the steps of:

radiating the object with a 90° rf NMR nutation pulse followed by a sequence of 180° rf NMR nutation pulses;

imposing a spatially selective magnetic gradient pulse $G_z$ upon said object during the occurrence of each said rf nutation pulse so that only nuclei in a selected portion of said object are thereby nutated;

the polarity of said $G_z$ magnetic gradient pulse periodically having opposite values for different ones of said nutation pulses; and imposing $G_x$ and $G_y$ phase encoding magnetic gradient pulses and recording NMR spin echo data resulting from said 180° rf NMR nutation pulses.

26. A method of acquiring NMR spin echo image data from an object comprising the steps of: and eliciting NMR spin echo responses from a selected portion of said object using a 90 rf nutation pulse followed by at least one 180° rf nutation pulse; and dividing the NMR spin echo response into separate differently phased portions by applying to said object a magnetic gradient pulse of a first polarity between a pair of opposite polarity magnetic gradient pulses during the occurrence time of the spin echo response.

* * * * *